United States Patent
Lecuppe et al.

(10) Patent No.: US 6,848,945 B1
(45) Date of Patent: Feb. 1, 2005

(54) PART FOR SUPPORTING AND FIXING AN ELECTRICAL OR ELECTRONIC COMPONENT

(75) Inventors: Thomas Lecuppe, Montfaucon (FR); Beatrice Bouriot, Ferney-Voltaire (FR)

(73) Assignee: Sofanou S.A., Anteuil (FR)

( * ) Notice: Subject to any disclaimer, the term of this patent is extended or adjusted under 35 U.S.C. 154(b) by 0 days.

(21) Appl. No.: 10/607,002

(22) Filed: Jun. 26, 2003

Related U.S. Application Data

(63) Continuation of application No. PCT/IB02/00179, filed on Jan. 22, 2002.

(30) Foreign Application Priority Data

Jan. 23, 2001 (FR) .......................................... 01 00973

(51) Int. Cl.[7] .............................................. H01R 13/66
(52) U.S. Cl. ...................................... 439/620; 439/409
(58) Field of Search ................................ 439/620, 404, 439/409, 410, 417, 392

(56) References Cited

U.S. PATENT DOCUMENTS

| | | | | |
|---|---|---|---|---|
| 4,725,247 A | * | 2/1988 | Fremgen ..................... | 439/392 |
| 4,822,298 A | * | 4/1989 | Gerke et al. ................ | 439/417 |
| 5,076,801 A | | 12/1991 | Schroll | |
| 5,846,098 A | * | 12/1998 | Shiga et al. ................ | 439/409 |
| 6,127,903 A | * | 10/2000 | Foley ......................... | 439/620 |

FOREIGN PATENT DOCUMENTS

| | | |
|---|---|---|
| FR | 2 306 597 | 10/1976 |
| GB | 762 640 | 11/1956 |

* cited by examiner

*Primary Examiner*—Tho D. Ta
(74) *Attorney, Agent, or Firm*—Sturm & Fix LLP

(57) ABSTRACT

The invention concerns a part for supporting and fixing an electric or electronic component, comprising a compartment supporting the electric component, two clamps each engaged and in electrical continuity with a pin of the electric or electronic component arranged in the compartment between the two clamps and a removable closure cap. The invention is characterised in that a blade is fixed on the closure cap to cut a electric wire engaged and in electrical continuity with the two clamps so as to mount the electric or electronic component in series on the electric wire. Preferably, the supporting and fixing part comprises a block to act as support for the electric wire when it is being cut by the blade and apertures providing clearance for the two strands of the cut electric wire.

3 Claims, 3 Drawing Sheets

PART FOR SUPPORTING AND FIXING AN ELECTRICAL OR ELECTRONIC COMPONENT

CROSS REFERENCE TO RELATED APPLICATIONS

This application is a Continuation application of PCT/IB02/00179 filed Jan. 22, 2002, which claimed priority of French Application No. 0100973 filed Jan. 23, 2001, entitled "Part for Supporting and Fixing an Electric or Electronic Component" all of which are included in their entirety by reference made hereto.

BACKGROUND OF THE INVENTION

1. Field of the Invention

The invention relates to a part for supporting and fixing an electrical or electronic component, and more particularly to a part of this kind comprising a compartment for supporting the electrical or electronic component, two claws which are each in engagement and in electrical continuity with a pin on the electrical or electronic component disposed in the supporting compartment between the two claws, and a detachable closing cover.

2. Brief Description of the Related Art

A part of this type is especially known from document U.S. Pat. No. 5,076,801. According to this disclosure, at least two distinct electric wires are each in engagement and in electrical continuity with each of the claws and the detachable closing cover is designed to hold each electric wire in position on each claw. As a result of this arrangement, connection of the electrical component in series with just one single electric wire necessitates prior severing into two distinct electric strands.

Parts for supporting and fixing an electrical component that necessitate prior severing of just one single electric wire into two distinct electric strands for connecting the electrical component in series are also known from documents FR 2 306 597 and GB 762 640.

BRIEF SUMMARY OF THE INVENTION

The object of the invention is to modify a part for supporting and fixing an electrical or electronic component, which part is known in the prior art, in such a way as to permit the connection of the electrical component in series with an electric wire without prior severing of the said electric wire.

To that end, the subject of the invention is a part for supporting and fixing an electrical or electronic component, which part comprises a compartment for supporting the electrical or electronic component, two claws which are each in engagement and in electrical continuity with a pin on the electrical or electronic component disposed in the supporting compartment between the two claws, and a detachable closing cover, characterised in that a blade is fixed to the detachable closing cover so as to sever an electric wire which is in engagement and in electrical continuity with the two claws in such a way as to connect the electrical or electronic component in series with the electric wire.

As a result of this arrangement, the electrical or electronic component is connected in series with the electric wire without prior severing of the latter. This results in greater ease of connection of the component, whether the latter is a passive component, such as a resistance, an inductance, a capacitance, a diode, or any other electrical or electronic component.

The supporting and fixing part according to the invention facilitates, for example, the connection of an electrical or electronic disturbance-reducing component to a supply cable.

Among the advantages of the supporting and fixing part according to the invention, small overall dimensions should be mentioned. The claws make it possible to bare the electric wire so as to ensure perfect electrical continuity with the component.

Other advantages of the invention will become apparent on reading the description of a mode of implementation which is illustrated by the drawings.

DETAILED DESCRIPTION OF THE PREFERRED EMBODIMENT

Figure 1:
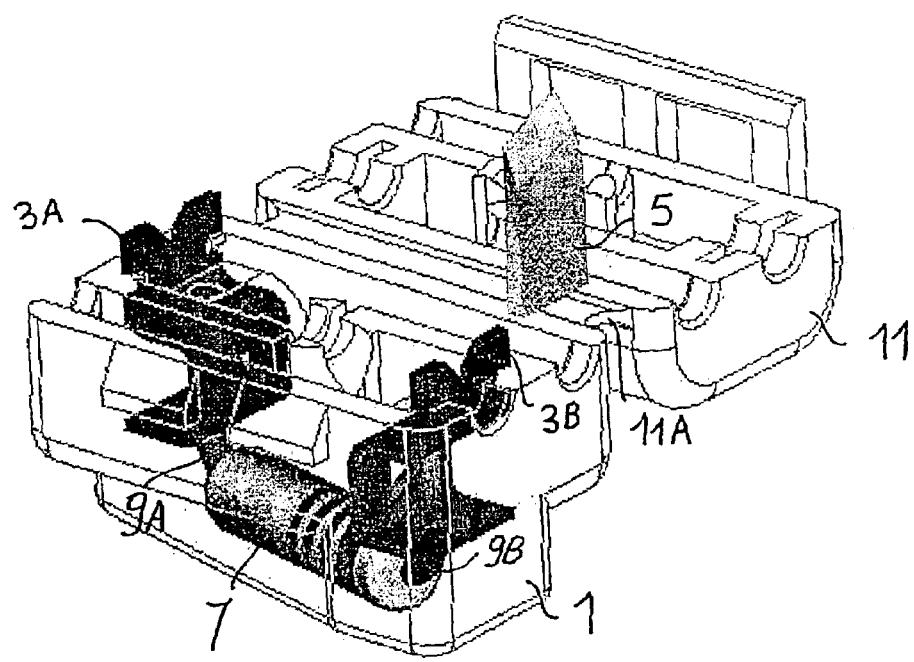
FIG. 1 shows a supporting and fixing part according to the invention, the closing cover being in the open position.

A part for supporting and fixing an electrical or electronic component comprises—FIGS. 1 to 5—a supporting compartment 1, two claws 3A, 3B and a detachable cover 11. The two claws 3A, 3B each bring about engagement and electrical continuity with a pin 9A, 9B on the electrical or electronic component 7 disposed in the supporting compartment 1 which is, for example, a body made of plastic material.

According to the invention, a blade 5 is fixed to the detachable or pivoting closing cover 11 so as to sever an electric wire 13 which is in engagement and in electrical continuity with the two claws 3A, 3B.

The two claws 3A, 3B are designed to cut into an insulating sheath 13A surrounding the conductive core 13B of the electric wire 13. In this way, they ensure electrical continuity between the electric wire 13 and the pins 9A, 9B of the electrical component 7 while at the same time holding the electric wire during the severing operation by the blade 5.

The closing cap 11 is detachable. As is illustrated by FIGS. 1 to 5, provision is also made for a closing cover 11 that pivots about a hinge 11A in relation to the supporting compartment 1 between an opening position and a closing position in which the said cover is shut down onto the said supporting compartment 1.

Figure 2:
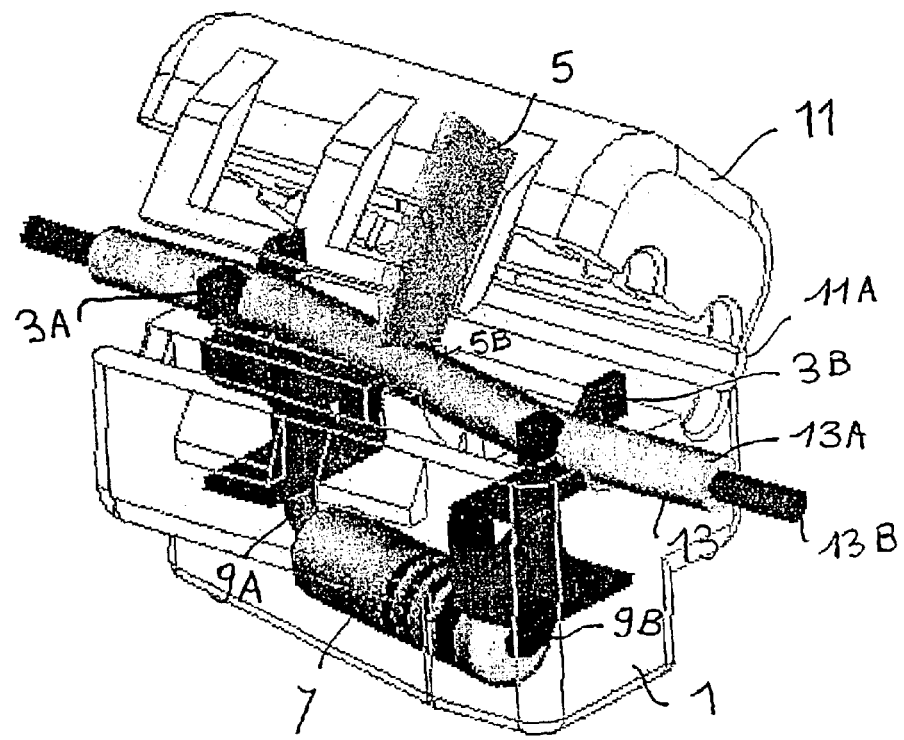
FIG. 2 shows the supporting and fixing part from FIG. 1, the closing cover being in an intermediate position between opening and closing.
Figure 3:
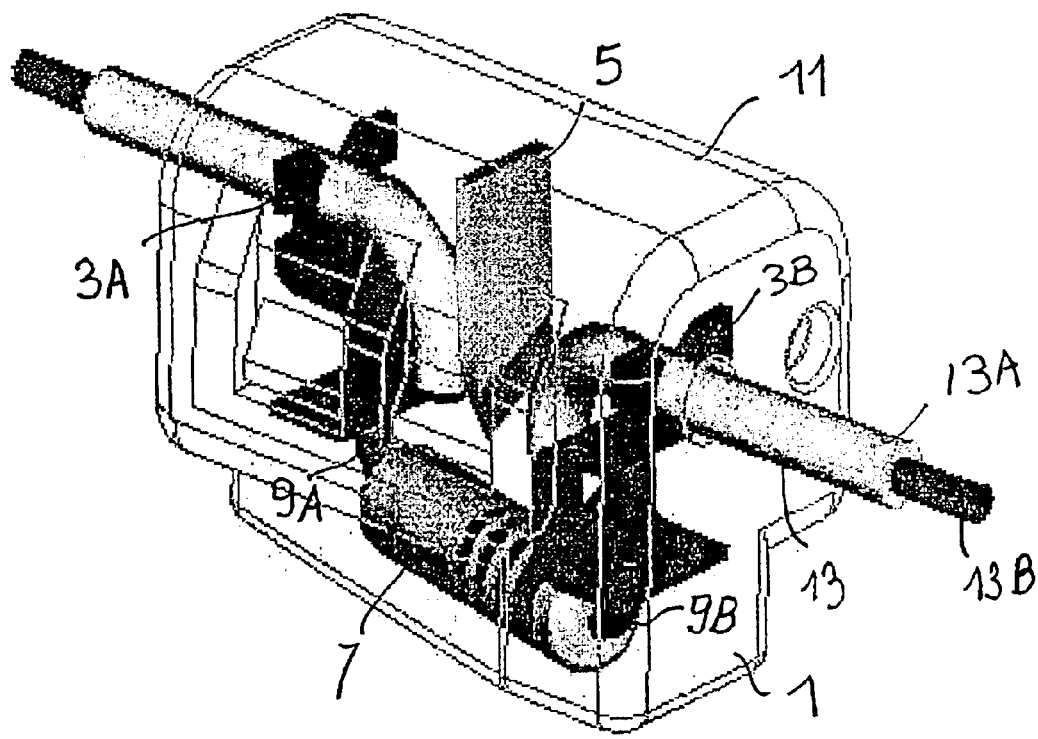
FIG. 3 shows the supporting and fixing part from FIG. 1, the closing cover being in the closed position.

FIGS. 1 to 3 illustrate the functioning of the supporting and fixing part according to the invention so as to connect the electrical or electronic component 7 in series with the electric wire 13, without severing the latter beforehand. FIG. 1: the closing cover 11 is in the open position in relation to the plastic body 1. In this position, the electric wire 13 is fixed in each of the two claws 3A, 3B. FIG. 2: the closing cover 11 is displaced in a pivoting movement about the hinge 11A in relation to the body 1 made of plastic material, so as to bring the blade 5 progressively closer to the electric wire 13. FIG. 3: the closing cover 11 is shut down onto the body 1 made of plastic material in the closing position so as to sever the electric wire 13, which is held by the claws 3A, 3B during the severing operation.

Figure 4:
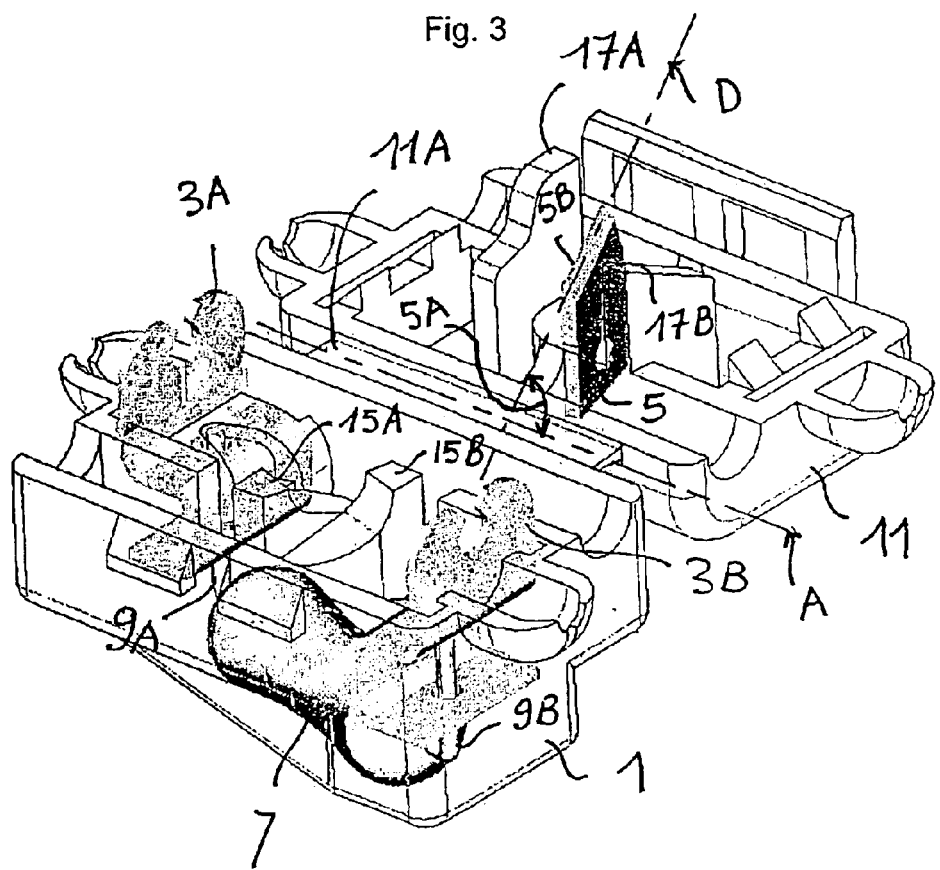
FIG. 4 shows a preferred form of embodiment of the supporting and fixing part illustrated by FIGS. 1 to 3, the cover being in the open position from FIG. 2.
Figure 5:
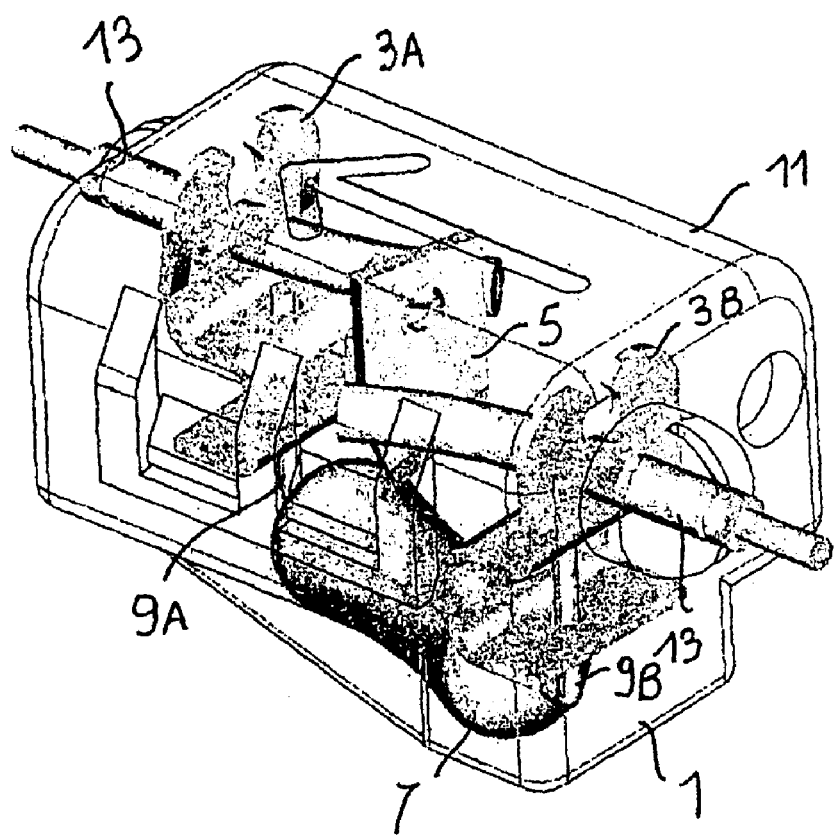
FIG. 5 shows the supporting and fixing part illustrated by FIG. 4, the cover being in the closed position from FIG. 3.

In a preferred mode of implementation, which is illustrated by FIGS. 4 and 5, the part for supporting and fixing the electrical or electronic component comprises a block 15 which is disposed in the body 1 made of plastic material so as to serve as a support for the electric wire 13 during the severing operation by the blade 5. The block 15 comprises two opposed bearing surfaces 15A, 15B and is split so as to allow the blade 5 to pass through, the width of the split corresponding to the thickness of the blade 5 so that the severing operation is clean. Moreover, the part for supporting and fixing the electrical or electronic component comprises baffles 17A, 17B fixed to the closing cover 11 so as to promote the disengagement of the two strands of the severed electric wire 13 and thus avoid contact between the said strands and the blade 5.

The blade 5 also has a setting angle which, like the constituent material of the said blade 5, depends upon the materials which constitute the electric wire, especially the insulating sheath and the conductive core of the said wire. The blade is preferably manufactured from cold-rolled stainless steel so as to ensure a satisfactory working life.

When the closing cover 11 is a pivoting one, the blade 5 possesses a leading angle 5A such that the cutting edge 5B extends in a direction D which intersects the direction a of the hinge 11a for pivoting in relation to the supporting compartment 1.

What is claimed is:

1. A part for supporting and fixing an electrical or electronic component, which part comprises a compartment for supporting the electrical or electronic component, two claws which are each in engagement and in electrical continuity with a pin on the electrical or electronic component disposed in the compartment between the two claws, and a detachable closing cover, wherein a blade is fixed to the closing cover so as to sever an electric wire which is in engagement and in electrical continuity with the two claws in such a way as to connect the electrical or electronic component in series with the electric wire, wherein it comprises a block so as to serve as a support for the electric wire during the severing operation by the blade, and further comprises baffles fixed to the detachable closing cover to promote the disengagement of the two strands of the severed electric wire.

2. A supporting and fixing part according to claim 1, wherein the detachable closing cover is replaced by a closing cap that pivots in relation to the supporting compartment about a hinge and wherein the baffles are fixed to the closing cap.

3. A supporting and fixing part according to claim 2, wherein the blade possesses a leading angle such that the cutting edge extends in a direction which intersects the direction of the pivoting hinge.

\* \* \* \* \*